US006771868B2

United States Patent
Johnson et al.

(10) Patent No.: US 6,771,868 B2
(45) Date of Patent: *Aug. 3, 2004

(54) USE OF DEUTERATED GASES FOR THE VAPOR DEPOSITION OF THIN FILMS FOR LOW-LOSS OPTICAL DEVICES AND WAVEGUIDES

(75) Inventors: Frederick G. Johnson, Lanham, MD (US); Oliver S. King, Annapolis, MD (US); John V. Hryniewicz, Columbia, MD (US); Lance G. Joneckis, Severna Park, MD (US); Sai T. Chu, Greenbelt, MD (US); David M. Gill, Pasadena, MD (US)

(73) Assignee: Little Optics, Inc., Annapolis Junction, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/465,881

(22) Filed: Jun. 20, 2003

(65) Prior Publication Data

US 2003/0210880 A1 Nov. 13, 2003

Related U.S. Application Data

(63) Continuation of application No. 09/944,207, filed on Sep. 4, 2001, now Pat. No. 6,614,977.
(60) Provisional application No. 60/304,811, filed on Jul. 12, 2001.

(51) Int. Cl.[7] .................................................. G02B 6/10
(52) U.S. Cl. ...................... 385/129; 385/130; 385/131; 385/141
(58) Field of Search ............................... 385/129, 130, 385/131, 141, 142, 144, 14

(56) References Cited

U.S. PATENT DOCUMENTS 4,138,194 A    2/1979   Beasley et al.

(List continued on next page.)

FOREIGN PATENT DOCUMENTS

| JP | 05173043 A | * 7/1993 | ............ G02B/6/40 |
| WO | WO 01/64594 | 9/2001 | |
| WO | WO 02/35265 | 5/2002 | |

OTHER PUBLICATIONS

J. Yota, J. Hander, and A.A. Saleh, "A Comparative Study on Inductively–Coupled Plasma High–Density Plasma, Plasma–Enhanced, and Low–Pressure Chemical Vapor Deposition Silicon Nitride Films", J. Vac. Sci. Technol. A Vol. 18, No. 2, pp. 372–376, Mar./Apr. 2000.

(List continued on next page.)

Primary Examiner—Akm Enayet Ullah
Assistant Examiner—Sung Pak
(74) Attorney, Agent, or Firm—Piper Rudnick LLP; Steven B. Kelber

(57) ABSTRACT

Devices and methods for the vapor deposition of amorphous, silicon-containing thin films using vapors comprised of deuterated species. Thin films grown on a substrate wafer by this method contain deuterium but little to no hydrogen. Optical devices comprised of optical waveguides formed using this method have significantly reduced optical absorption or loss in the near-infrared optical spectrum commonly used for optical communications, compared to the loss in waveguides formed in thin films grown using conventional vapor deposition techniques with hydrogen containing precursors. In one variation, the optical devices are formed on a silicon-oxide layer that is formed on a substrate, such as a silicon substrate. The optical devices of some variations are of the chemical species $SiO_xN_y$:D. Since the method of formation requires no annealing, the thin films can be grown on electronic and optical devices or portions thereof without damaging those devices.

40 Claims, 4 Drawing Sheets

U.S. PATENT DOCUMENTS

| | | | |
|---|---|---|---|
| 4,384,038 A | 5/1983 | Khoe et al. | |
| RE31,868 E | 4/1985 | Beasley et al. | |
| 4,583,997 A | 4/1986 | Staudigl | |
| 4,689,065 A | 8/1987 | Krause | |
| 4,863,236 A | 9/1989 | Herbrechtsmeier et al. | |
| 5,053,244 A | 10/1991 | Kieser et al. | |
| 5,059,475 A | 10/1991 | Sun et al. | |
| 5,062,680 A | 11/1991 | Imamura et al. | |
| 5,175,790 A | 12/1992 | Groh et al. | |
| 5,196,041 A | 3/1993 | Tumminelli et al. | |
| 5,295,220 A | 3/1994 | Heming et al. | |
| 5,323,482 A | 6/1994 | Stewart et al. | |
| 5,332,827 A | 7/1994 | Stewart et al. | |
| 5,385,594 A | 1/1995 | Kanamori et al. | |
| 5,503,650 A | 4/1996 | Ishikawa et al. | |
| 5,547,706 A | 8/1996 | Ackerman | |
| 5,588,083 A | 12/1996 | Boonstra et al. | |
| 5,593,741 A | 1/1997 | Ikeda | |
| 5,672,672 A | 9/1997 | Amano et al. | |
| 5,688,896 A | 11/1997 | Boonstra et al. | |
| 5,844,363 A | 12/1998 | Gu et al. | |
| 5,872,387 A | 2/1999 | Lyding et al. | |
| 5,949,945 A | 9/1999 | Okano et al. | |
| 5,972,765 A | 10/1999 | Clark et al. | |
| 5,979,188 A | 11/1999 | Ojha | |
| 6,023,093 A | 2/2000 | Gregor et al. | |
| 6,025,280 A | 2/2000 | Brady et al. | |
| 6,077,791 A | 6/2000 | DeTar | |
| 6,122,934 A | 9/2000 | Narita et al. | |
| 6,144,795 A | 11/2000 | Dawes et al. | |
| 6,154,582 A | 11/2000 | Bazylenko et al. | |
| 6,160,945 A | 12/2000 | Rhee et al. | |
| 6,192,712 B1 | 2/2001 | Saito et al. | |
| 6,211,065 B1 | 4/2001 | Xi et al. | |
| 6,233,381 B1 | 5/2001 | Borrelli et al. | |
| 6,614,977 B2 * | 9/2003 | Johnson et al. | 385/129 |

OTHER PUBLICATIONS

L. Martinu, and D. Poitras, "Plasma Deposition of Optical Films and Coatings: A Review", J. Vac. Sci. Technol. A vol. 18, No. 6, pp. 2619–2645, Nov./Dec. 2000.

G. Grand, J.P. Jadot, H. Denis, S. Valette, A. Fournier, and A.M. Grouillet, "Low–Loss PECVD Silica Chanel Waveguides For Optical Communications", Electronic Letters, vol. 26, No. 25, pp. 2135–2137, Dec. $6^{th}$ 1990.

J. Yeh, and S. Lee, "Structural and Optical Properties of Amorphous Silicon Oxynitride", J. Appl. Phys. vol. 79, No. 2, pp. 656–663, Jan. 15, 1996.

A. Shih, J. Yeh, S. Lee, and T.R. Yang, "Structural and Electronic Differences Between Deuterated and Hydrogenated Amorphous Silicon", J. Appl. Phys. vol. 88, No. 3, pp. 1684–1687, Aug., 1, 2000.

R. Germann, H.W.M. Salemink, R. Beyeler, G.L.Bona, F. Horst, I. Massarek, and B.J. Offrein, "Silicon Oxynitride Layers for Optical Waveguide Applications", J. Electrochemical Society, vol. 147, No. 6 pp. 2237–2241, 2000.

T. Watanabe, N. Ooba, S. Hayashida, T. Kurihara, and S. Imamura, "Polymeric Optical Waveguide Circuits Formed Using Silicone Resin", J. Lightwave Technology, vol. 16, No. 6, pp. 1049–1055, Jun. 1998.

Akwani et al, 20020154878 A1, Oct. 2002.

* cited by examiner

US 6,771,868 B2

USE OF DEUTERATED GASES FOR THE VAPOR DEPOSITION OF THIN FILMS FOR LOW-LOSS OPTICAL DEVICES AND WAVEGUIDES

This application is a continuation of and claims priority from U.S. patent application Ser. No. 09/944,207 filed Sep. 4, 2001, now U.S. Pat. No. 6,614,977, which claims priority to U.S. Provisional Application Serial No. 60/304,811 filed Jul. 12, 2001. The entirety of these applications are incorporated herein by reference.

BACKGROUND OF THE INVENTION

1. Field of the Invention

The present invention relates to the vapor deposition of silicon-containing, amorphous thin films, and in particular to vapor deposition of silicon-containing, non-polymeric amorphous thin films with significantly reduced optical absorption (reduced optical loss) in the near-infrared optical communications wavelength region of about 1.45 to 1.65 microns for such uses as in the fabrication of optical devices, such as optical waveguides, ring resonators, arrayed waveguide grating multiplexers/demultiplexers, optical add/drop multiplexers, optical switches, variable attenuators, and dispersion compensators.

2. Background of the Technology

Conventional vapor deposition methods used for growing silicon-containing amorphous thin films on substrates for optical device applications typically rely on at least one hydrogen-bearing source gas. For example, silicon-oxide ($SiO_2$) 1 or silicon-oxynitride ($SiO_xN_y$) 2 thin films, as shown in FIG. 1, are grown on a substrate 3 using low pressure chemical vapor deposition (LPCVD) (see, e.g., J. Yota, J. Hander, and A. A. Saleh, "A comparative study on inductively-coupled plasma high-density plasma, plasma-enhanced, and low pressure chemical vapor deposition silicon nitride films," J. Vac. Sci. Technol. A 18 (2), 372 (2000)) or plasma enhanced chemical vapor deposition (PECVD) (see, e g., L. Martinu and D. Poitras, "Plasma deposition of optical films and coatings: A review," J. Vac. Sci. Technol. A 18 (6), 2619 (2000)). These techniques generally rely on silane ($SiH_4$) and ammonia ($NH_3$) as source gases for silicon and nitrogen, in combination with an oxygen bearing gas, such as $O_2$ or $N_2O$. The resulting as grown $SiO_xN_y$ films contain substantial amounts of hydrogen (2–25%) in the form of Si—H, N—H, and O—H bonds. The presence of atomic hydrogen affects many of the film's physical properties, including density, porosity, optical absorption, index of refraction, hardness, and stress.

One problem with near-infrared optical device applications using these materials is optical absorption, or loss, in the near-infrared optical communication wavelength region from 1.45 to 1.65 microns. The absorption occurs at least partially due to an effect commonly referred to as "stretching mode"—the motion of atoms that occurs in perpendicular directions on the same axis, away from each other. As a result, simple optical waveguides having a waveguide core consisting of vapor deposited $SiO_xN_y$ show optical losses of 10 dB/cm and higher for optical wavelengths near 1.51 microns, which results from optical absorption by the overtones of the vibrational stretching modes of Si—H and N—H bonds (see, e.g., G. Grand, J. P. Jadot, H. Denis, S. Valette, A. Fournier, and A. M. Grouillet, "Low-loss PECVD silica channel waveguides for optical communications," Electronics Letters 26 (25), 2135 (1990)). In addition, there is also significant infrared absorption near 1.4 microns, resulting from the presence of O—H bonds.

One way to eliminate this effect is to remove the hydrogen from the substance through which the light is being transmitted. A technique commonly used to accomplish this removal is to anneal the films at high temperatures (~1140° C.), driving as much of the hydrogen from the film as possible (see, e.g., R. Germann, H. W. M. Salemink, R. Beyeler, G. L. Bona, F. Horst, I Massarek, and B. J. Offrein, "Silicon oxynitride layers for optical waveguide applications," Journal of the Electrochemical Society 147 (6), 2237 (2000)). This technique can substantially reduce the optical loss in the wavelength region of interest to below 1 dB/cm, but at the expense of an additional process step that can cause shrinkage of the film and introduce significant tensile stress in the film. These effects can create cracks in the film and bowing of the wafers.

These effects occur because the annealing temperature is high enough to drive hydrogen atoms out of the film, but not high enough to melt the film and allow it to flow and reshape. The resulting stretch or bending of the wafer makes the wafer difficult to process using lithography and standard semiconductor processing techniques. Finally, this process results in a number of dangling bonds of silicon atoms remaining in the film, and if the film is later exposed to sources of hydrogen, such as water vapor from humidity, the hydrogen can react and reattach to the silicon, eventually resulting in the same problem with absorption that was present absent annealing.

Low optical losses at near-infrared wavelengths have been achieved in organic polymer devices and optical fibers by making use of deuterated and halogenated materials, but these methods and devices are not useful for integrated and other non-polymeric optical devices. (See, e g, U.S. Pat. No. 5,062,680 to S. Imamura; U.S. Pat. No. 5,672,672 to M. Amano; T. Watanabe, N. Ooba, S. Hayashida, T. Hurihara, and S. Imamura "Polymeric optical waveguide circuits formed using silicone resin," Journal of Lightwave Technology 16 (6), 1049 (1998); U.S. Pat. No. 6,233,381 to Borrelli et al.) Deuterated gases have also been applied to the field of semiconductor electronics to create insulating and passivation layers in semiconductor transistor devices for such purposes as to mitigate hot-electron effects in gate oxides, but these methods and devices have no applicability to integrated and other non-organic optical devices, nor are the purposes for which deuterium is used in semiconductor transistor devices generally useful for producing optical devices. (See, e.g., U.S. Pat. No. 5,972,765 to W.F. Clark; U.S. Pat. No. 6,025,280 to D.C. Brady; U.S. Pat. No. 6,023,093 to Gregor et al.; U.S. Pat. No. 6,077,791 to M. A. DeTar.) Each of the references referred to herein is hereby incorporated by reference in its entirety.

There remains an unmet need to provide optical devices, including non-polymeric passive optical devices and integrated optical devices that have low optical losses at selected wavelengths. There is a further need to provide devices and methods of making devices for use with waveguides on wafers, such as planar lightwave circuits, including circuits with multiple devices connected by waveguides on a single wafer, that incorporate other processes than annealing and overcome the problems with this technique.

SUMMARY OF THE INVENTION

The present invention relates to optical devices, including integrated optical devices, and methods for fabrication via vapor deposition of non-polymeric, silicon-containing thin films using vapor sources, such as deuterated liquids, comprised of deuterated species. With embodiments of the present invention, thin films are grown on a substrate to form optical devices or portions thereof that have at least one deuterium containing layer. These devices have significantly reduced optical absorption or loss in the near-infrared optical spectrum, which is the spectrum commonly used for optical communications, compared to the loss in waveguides formed in thin films grown using conventional vapor deposition techniques and hydrogen containing precursors.

The devices produced in accordance with embodiments of the present invention have deuterium in place of hydrogen within bonds for the formed films. Deuterium, which is an isotope of hydrogen that has a neutron in its nucleus, vibrates within bonds with other atoms at frequencies different from hydrogen in the same bonds. This difference in frequency results from the increased mass of deuterium over hydrogen. Because of the different frequency of vibration of the deuterium in these bonds, relative to hydrogen, different wavelengths of energy, including light, are absorbed within the materials formed using deuterium than the wavelengths absorbed by the same materials when hydrogen is present. Deuterium used in the formation of optical devices in accordance with the present invention results in shifts of energy peaks for these materials, such that the primary band of wavelengths to be transmitted, in the 1.45 to 1.65 micron range, are no longer absorbed by the material of these devices.

In one embodiment of the present invention, deuterated gases (gases and vapors are used interchangeably herein), such as $SiD_4$ and $ND_3$ (D being deuterium), serving as precursors, along with a gaseous source of oxygen, such as nitrous-oxide ($N_2O$) or oxygen ($O_2$), are used for the chemical vapor deposition of silicon-oxynitride ($SiO_xN_y$:D) or other non-polymeric thin films on a cladding. The cladding is composed, for example, of silicon oxide ($SiO_2$), phosphosilicate glass, fluorinated silicon oxide, or $SiO_xN_y$:D having an index of refraction less than that of the thin film. In an embodiment of the present invention, the cladding is formed on a substrate, such as silicon, quartz, glass, or other material containing germanium, fused silica, quartz, glass, sapphire, SiC, GaAs, InP, or silicon. In embodiments of the present invention, the thin film and the cladding formed on the substrate can vary in thickness and width, depending, for example, on the device being formed. In embodiments of the present invention, the cladding is formed with a thickness varying from 2 to 20 microns, and the thin film is formed with a thickness varying from about 0.5 to 5 microns. Other thicknesses of the cladding and the thin film are also usable in accordance with the present invention.

In accordance with embodiments of the present invention, ridge structures can be formed from the thin deuterium containing films such as $SiO_xN_y$, $Si_3N_4$, or $SiO_2$, by an etching process, such as reactive ion etching (RIE), to form an optical waveguide, one basic building block of integrated optical devices.

Embodiments of the present invention include formation of the integrated or other optical devices on substrates that include or have formed upon them other electronic or optical devices, or formed portions thereof, referred to herein as "preformed devices." These preformed devices can include, for example, field-effect transistors (FETs), such as metal-oxide-semiconductor FETs (MOSFETs), electronic amplifiers, preamplifiers, devices containing pn junctions, transformers, capacitors, diodes, laser drivers, lasers, optical amplifiers, optical detectors, optical waveguides, modulators, optical switches, or other electronic or optical devices. These examples are intended to be merely illustrative of integrated and other devices upon which the thin film of the present invention may be formed. The present invention has the advantage over the prior art that formation on these devices is possible because no annealing is required, which, in the prior art, potentially damages the devices on which the film is grown or otherwise formed.

In other embodiments of the present invention, rather than a silicon-oxynitride film, silicon nitride ($Si_3N_4$) or silicon-oxide ($SiO_2$) films are grown using the techniques of the present invention to eliminate either the oxygen bearing gas or the deuterated ammonia gas, respectively. As with films using silicon-oxynitride, by using deuterated gases instead of the hydrogenated versions of silane and ammonia ($SiH_4$ and $NH_3$), the resulting thin films have virtually zero hydrogen content and instead contain some deuterium.

Examples of deuterated liquids usable to produce the deuterated gases include deuterated tetraethoxysilane, deuterated tetraethylorthosilicate, deuterated hexamethyldisiloxane, deuterated hexamethyldisilazane, deuterated tetramethoxysilane, and deuterated tetramethyldisiloxane. Examples of precursors containing deuterium include $SiD_4$, $Si_2D_6$, $SiDCl_3$, $SiCl_2D_2$, $ND_3$, $GeD_4$, $PD_3$, $AsD_3$, $CD_4$, and $D_2S$.

Layers may be formed on substrates using deuterated gases, in accordance with embodiments of the present invention, via any of a number of chemical vapor deposition and other techniques known in the art for forming thin layers on integrated components, including plasma enhanced chemical vapor deposition (PECVD), high density plasma chemical vapor deposition (HDPCVD), low pressure chemical vapor deposition (LPCVD), atmospheric pressure chemical vapor deposition (APCVD), jet vapor deposition (JVD), flame hydrolysis, and electron cyclotron resonance (ECR) chemical vapor deposition. Embodiments of the present invention include replacing hydrogen atoms and/or molecules in the source gas species with deuterium in order to virtually eliminate the population of hydrogen in the growth chamber, and the resulting films grown by this method demonstrate complete replacement of incorporated hydrogen with deuterium atoms.

Additional advantages and novel features of the invention will be set forth in part in the description that follows, and in part will become more apparent to those skilled in the art upon examination of the following or upon learning by practice of the invention.

DETAILED DESCRIPTION

Embodiments of the present invention include use of one or more deuterated gases or vapors for the chemical vapor deposition of thin, inorganic, glassy films for low-loss near-infrared optical waveguides in the fields of optics and photonics.

Formed optical layers, such as PECVD grown $SiO_xN_y$, using conventional silane and ammonia, normally contain between 5% and 25% atomic content of hydrogen. This hydrogen exists as Si—H, O—H, and N—H bonds within the film. In $SiO_xN_y$, the stretching vibrational modes of Si—H bonds exist in a band around 2200 $cm^{-1}$, and the stretching vibrational modes of N—H bonds exist in a band around 3350 $cm^{-1}$ (see, e.g., J. Yeh and S. C. Lee, "Structural and optical properties of amorphous silcon oxynitride," J. Appl. Phys. 79 (2), 656 (1996)). The resulting mid-infrared absorption data show strong peaks at these energies. More importantly, however, the second overtone of the Si—H vibration and the first overtone of the N—H vibration are in the near-infrared spectral region of interest for optical communication applications, around 1.51 microns. The stretching vibrational mode associated with the O—H bond also displays significant absorption around 1.4 micron wavelengths.

Figure 1:
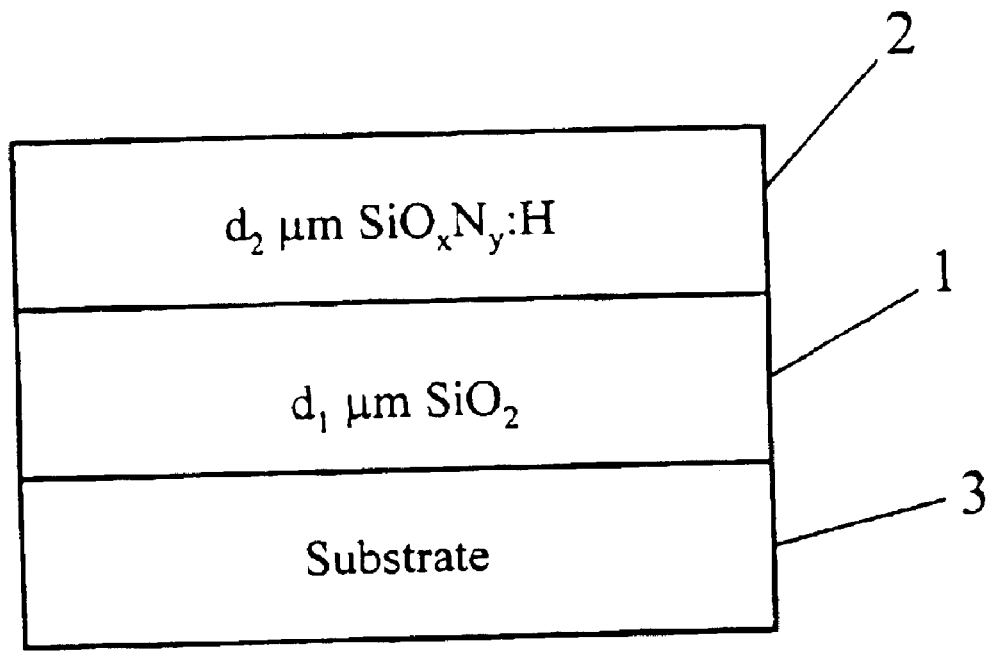
FIG. 1 is a wafer diagram depicting $SiO_xN_y$:H and $SiO_2$ thin films with layer thicknesses $d_1$ and $d_2$ microns and grown on a substrate, in accordance with the prior art.
Figure 2A:
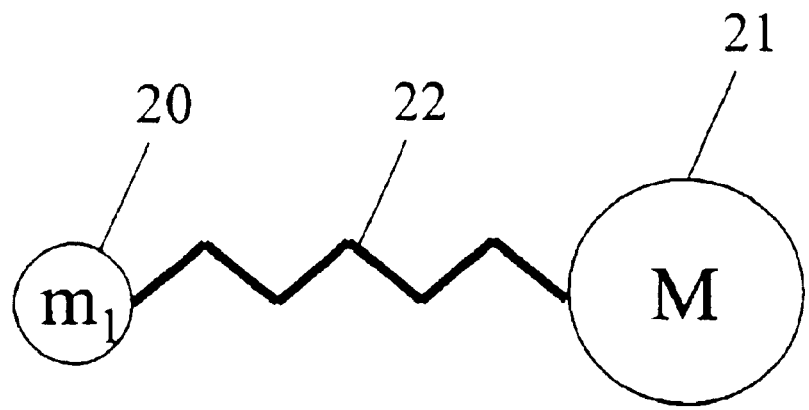
FIG. 2A is a diagram showing a single bond between two atoms of mass $m_1$ and M modeled as a simple harmonic oscillator, in accordance with an embodiment of the present invention.
Figure 2B:
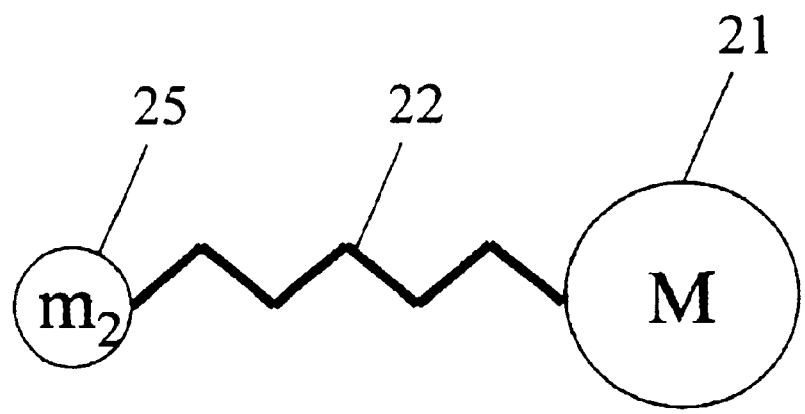
FIG. 2B is a diagram showing a single bond between two atoms of mass $m_2$ and M modeled as a simple harmonic oscillator, in accordance with an embodiment of the present invention.

The physics of the harmonic oscillation of atoms within bonds for optical devices will now be described further with regard to FIGS. 2A and 2B. As shown in FIG. 2A, two atoms 20, 21, are linked by bond 22. In this example, the first atom 20, represented by a lower case $m_1$, is a hydrogen atom, and the second atom 21, represented by an upper case M, is a larger atom, such as oxygen (O), silicon (Si), or nitrogen (N). In FIG. 2B, the first atom 25, represented by a lower case $m_2$, is a deuterium atom.

By using quantum mechanics and a simple model for a harmonic oscillator, the vibrational energy associated with the bond 22 can be shown to be as follows:

$$E_{vib}=(n+½)hcv_o \quad (1)$$

where E is energy, n is an integer quantum number, h is Planck's constant, c is the speed of light, and $v_o$ is the fundamental vibrational frequency. The fundamental frequency is given as:

$$v_o = (1/2\pi c) \sqrt{k(1/m + 1/M)} \quad (2)$$

where k is the force constant associated with the bond, m represents the mass of either the smaller atom, and M is the mass of the larger atom. For the case where hydrogen or deuterium is m, the expression for the vibrational energy can be simplified to:

$$E_{vib}\approx(n+½)h(½\pi)\sqrt{k/m} \quad (3)$$

As m is significantly smaller than M (M being the mass of Si, N, or O for the bond discussed in this example). As a result, the relative infrared absorption peak energies associated with these vibrations, comparing hydrogen to deuterium, change by roughly the following:

$$\frac{1}{\sqrt{2}}$$

as the hydrogen atom, consisting of one proton and one electron and having an atomic mass of one, is replaced by deuterium, consisting of one proton, one neutron, and one electron and having a mass of approximately two times the mass of the hydrogen atom.

As a result of this relative difference in mass of the smaller atom $m_2$ 25, as shown in FIG. 2B, when this atom is deuterium, rather than the hydrogen atom $m_1$ 20 of FIG. 2A, the vibrational modes associated with overtone two of Si—D and overtone one of N—D are shifted to longer wavelengths and do not appear in the 1.5 micron wavelength region, as they would with hydrogen. The nearest stretching vibrational mode associated with these two bonds with the use of deuterium in place of hydrogen is the third overtone of Si—D, near 1.61 microns. At shorter wavelengths, the nearest stretching mode is associated with the second overtone of the stretching mode from O—D and is just below 1.3 microns. The shift in the stretching mode vibrational energy has been demonstrated in hydrogenated amorphous silicon (a:SiH). The Si—H vibrational mode energy near 2000 $cm^{-1}$ has been shown to drop to 1460 $cm^{-1}$ when the hydrogen is replaced with deuterium to create Si—D bonds. (See, e.g., A. Shih, J. L. Yeh, S. C. Lee, and T. R. Yang, "Structural and electronic differences between deuterated and hydrogenated amorphous silicon," J. Appl. Phys. 88 (3), 1684 (2000).)

One overall result from applying the methods of the present invention is a much reduced optical absorption loss in these types of waveguides at wavelengths near 1.5 microns, from a value over 10 dB/cm for substances such as SiON:H to below 1 dB/cm for substances such as SiON:D, which is accomplished without the need for an annealing process step as required in the prior art. More complex integrated optical devices also benefit greatly when made from deuterium containing glassy films and similarly have a much reduced insertion loss in the spectral range near 1.5 micron wavelengths.

As a result of application of embodiments of the present invention, there are little or no absorption features in the spectrum of interest, and any loss of energy in devices constructed in accordance with embodiments of the present invention is dominated by scattering and waveguide losses. In contrast, similar waveguides formed from conventional PECVD grown SiON:H subsequent to thermal annealing steps, which reduce the hydrogen content, have greater propagation losses, with the spectra being dominated by absorption losses.

Figure 3A:
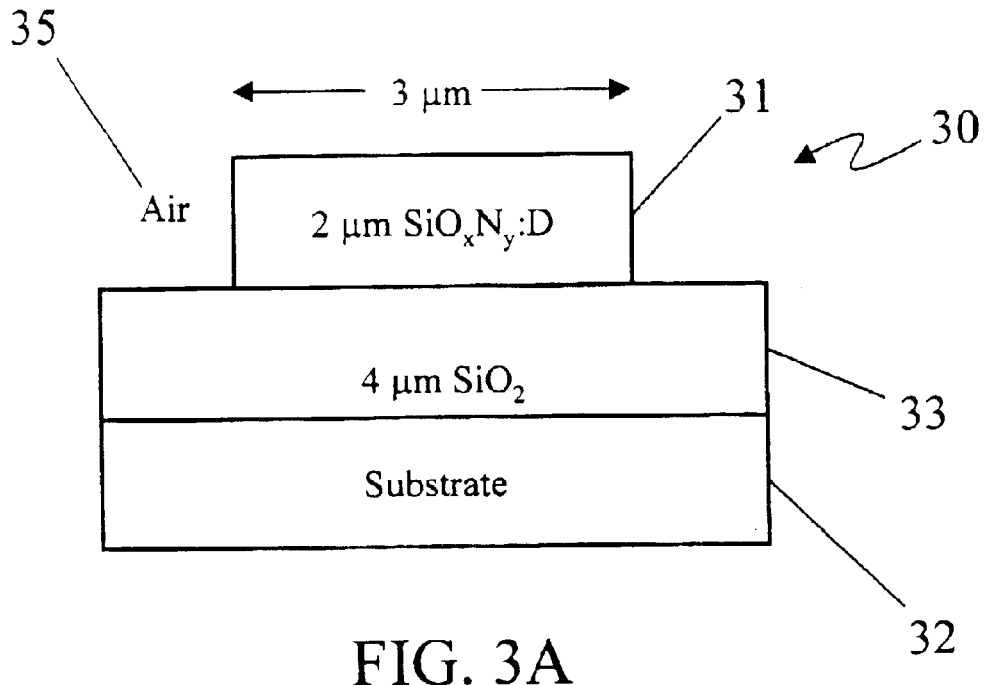
FIG. 3A shows a diagram of a 2 μm thick and 3 μm wide optical waveguide core formed from a $SiO_xN_y$:D film with air and $SiO_2$ cladding regions and grown on a substrate, such as a silicon substrate, in accordance with an embodiment of the present invention.
Figure 3B:
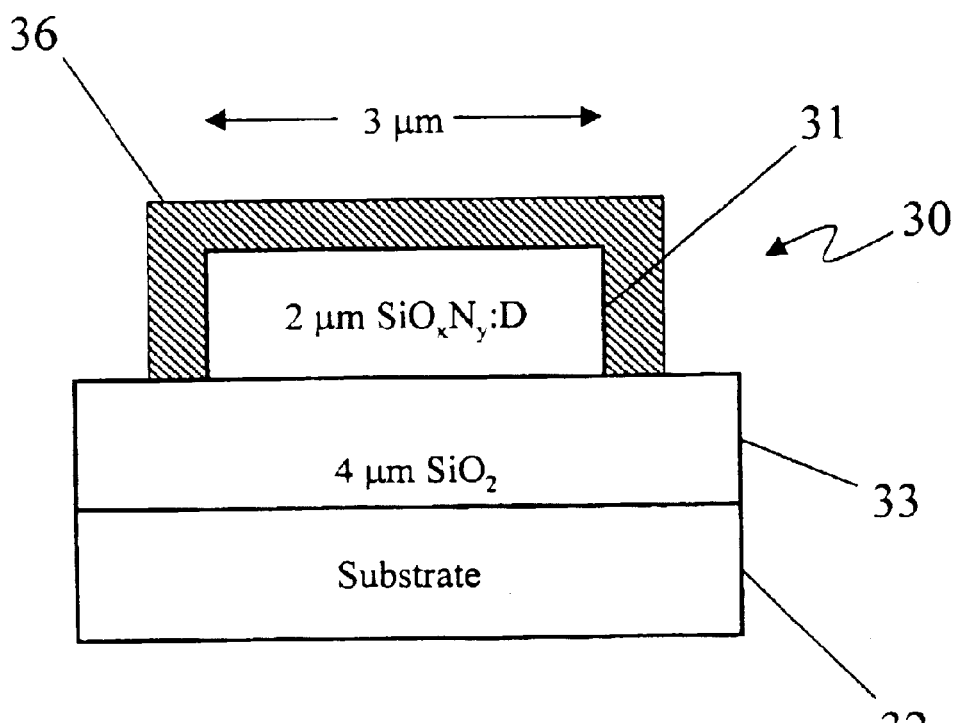
FIG. 3B shows a diagram of a 2 μm thick and 3 μm wide optical waveguide core formed from a $SiO_xN_y$:D film with $SiO_2$ and other cladding regions and grown on a substrate, such as a silicon substrate, in accordance with an embodiment of the present invention.
Figure 4:
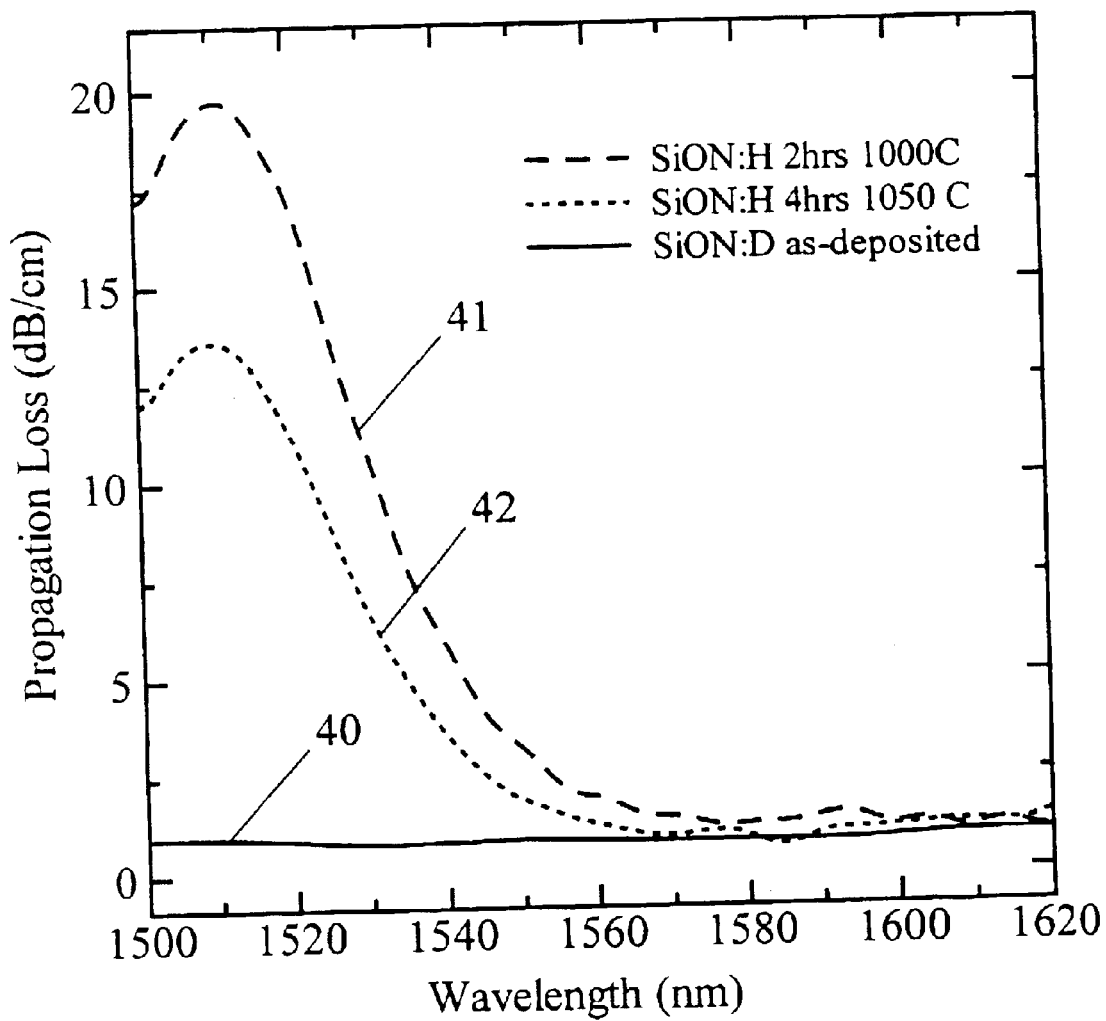
FIG. 4 presents a graph of propagation loss in dB/cm for the waveguide structure shown in FIG. 3, formed from unannealed PECVD grown SiON:D with an index of refraction of 1.59, in accordance with an embodiment of the present invention.

An example of formation of a device 30 in accordance with the present invention and the results produced will now be described in conjunction with FIGS. 3A, 3B, and 4. In this example, as shown in FIGS. 3A and 3B, a parallel plate PECVD system was used to deposit a 2 μm thin film of SiON:D 31 with a nominal index of refraction of 1.59 at a wavelength of 1.55 microns. The film is grown on a cladding 33, such as a 4 μm thick layer of silicon oxide ($SiO_2$), which is formed on the surface of a substrate 32, such as a silicon substrate. Embodiments of the present invention include formation of the film on a variety of optical cladding materials, and other use of optical cladding with the film of the present invention. The optical cladding can include any of a number of materials having a lower index of refraction than the thin film forming the optical component. Other example materials include silicon oxide, phosphosilicate glass, fluorinated silicon oxide, and $SiO_xN_y$ having a lower index of refraction than the $SiO_xN_y$:D forming the thin film. In addition, cladding covers the surface of the thin film 31. This cover cladding, in one embodiment, as shown in FIG. 3A is air 35, which has a lower index of refraction than the thin film 31. In FIG. 3B, the cover cladding 36 is another material, such as the same material as the cladding 33 on the substrate 32, or alternatively another material having a index of refraction less than that of the thin film 31, such as a polymer.

The deposition conditions for the example shown in FIGS. 3A and 3B are as follows: gas flows of 12 sccm $N_2O$, 7.2 sccm $ND_3$, and 64 sccm of 2% $SiD_4$ in an $N_2$ carrier gas with 10 W of 13.5 MHz radiofrequency (RF), a substrate temperature of 300° C., and a chamber pressure of about 300 mTorr. The growth rate for this example was approximately 8 nm/min. The wafer is processed to create ridge optical waveguides similar in cross-sectional structure to that of the film 31 shown in FIGS. 3A and 3B.

Testing has been made of devices formed in accordance with the structure shown in FIGS. 3A and 3B. The throughput of several waveguides of varying length has been measured using cutback to determine the propagation loss across the wavelength region of interest, producing the results shown in FIG. 4. The spectrum of SiON:D 40 is dominated by scattering and waveguide losses, and there are no apparent absorption features. For comparison, the propagation loss of waveguides formed from PECVD deposited SiON:H using non-deuterated gases 41, 42 is also shown in FIG. 4. These waveguides were annealed at 1000° C. for two hours and 1050° C. for four hours to reduce the hydrogen content and associated absorption losses. The resulting propogation losses for SiON:H 41, 42, respectively, as shown in FIG. 4, are dominated by absorption loss.

Another embodiment of the present invention includes formation of the integrated or other optical devices on other electronic or optical devices or formed portions thereof, these preformed devices including, for example, field-effect transistors (FETs), such as metal-oxide-semiconductor FETs (MOSFETs), electronic amplifiers, preamplifiers, devices containing pn junctions, transformers, capacitors, diodes, laser drivers, lasers, optical amplifiers, optical detectors, optical waveguides, modulators, optical switches, or other electronic or optical components. These examples are intended to be merely illustrative of integrated and other devices upon which the thin film of the present invention may be formed. Formation on these preformed devices is possible using the present invention because no annealing step is required, which, in the prior art, potentially damages the devices on which the film is grown or otherwise formed.

Example embodiments of the present invention have now been described in accordance with the above advantages. It will be appreciated that these examples are merely illustrative of the invention. Many variations and modifications will be apparent to those skilled in the art.

What is claimed is:

1. A method for making a device comprising an optical waveguide, the method comprising the steps of:
   forming a non-polymeric thin film comprising silicon and deuterium over a substrate with a vapor deposition technique using a precursor comprising deuterium, the non-polymeric thin film being suitable for use as an optical waveguide, an atomic density of the deuterium in the non-polymeric thin film being between about 0.1% and 30% of an atomic density of the thin film;
   forming a cover cladding over the thin film; and
   incorporating the non-polymeric thin film into a device;
   wherein processing performed after the thin film is formed is performed at temperatures such that changes in film stress are not experienced and changes in bowing of the substrate are avoided.

2. The method of claim 1, wherein the atomic density of the deuterium in the non-polymeric thin film is about 0.1% of the atomic density of the thin film.

3. The method of claim 1, wherein the atomic density of the deuterium in the non-polymeric thin film is about 30% of the atomic density of the thin film.

4. The method of claim 1, wherein the atomic density of the deuterium in the non-polymeric thin film is about 25% of the atomic density of the thin film.

5. The method of claim 1, wherein the atomic density of the deuterium in the non-polymeric thin film is about 2% of the atomic density of the thin film.

6. The method of claim 1, wherein the vapor deposition technique is high density plasma chemical vapor deposition (HDPCVD).

7. The method of claim 1, wherein the thin film comprises silicon and carbon.

8. The method of claim 1, wherein the thin film comprises silicon, oxygen, and carbon.

9. The method of claim 1, wherein the thin film comprises silicon, oxygen, carbon, and nitrogen.

10. The method of claim 1, wherein the vapor deposition technique includes using deuterated precursors comprising $SiD_4$ and $CD_4$.

11. The method of claim 1, wherein the vapor deposition technique includes using a first deuterated precursor comprising $SiD_4$ and at least one more precursor containing carbon.

12. The method of claim 1, wherein the vapor deposition technique includes using at least one deuterated precursor comprising silicon.

13. The method of claim 12, wherein the deuterated precursor comprising silicon is selected from the group consisting of $Si_2D_6$, $SiDCl_3$ and $SiD_2Cl_2$.

14. The method of claim 13, wherein the vapor deposition technique includes using an additional precursor comprising $CD_4$.

15. The method of claim 1, wherein the thin film is SiON with a refractive index of at least 1.59 such that the reduction in optical absorption is at least 10 dB at a wavelength within a band from 1.45 to 1.65 microns.

16. The method of claim 1, wherein the thin film is SiON with a refractive index of at least 1.59 such that the reduction in optical absorption is at least 20 dB at a wavelength within a band from 1.45 to 1.65 microns.

17. The method of claim 1, wherein the non-polymeric thin film is formed over an electronic device.

18. The method of claim 1, wherein the electronic device is a field effect transistor.

19. The method of claim 1, where the non-polymeric thin film comprises a composition selected from the group consisting of $SiO_2$ and $Si_3N_4$.

20. A device comprising:
   a wafer;
   a cladding formed over the wafer;
   at least one non-polymeric thin film containing silicon and deuterium formed over the cladding, the non-polymeric thin film containing deuterium, an atomic density of the deuterium in the non-polymeric thin film being between about 0.1% and 30% of the atomic density of the thin film; and
   a cover cladding formed over the thin film;

wherein there are no changes in bowing in the wafer resulting from high temperature processing of the thin film after the vapor deposition.

21. The device of claim 20, wherein the atomic density of the deuterium in the non-polymeric thin film is about 0.1% of the atomic density of the thin film.

22. The device of claim 20, wherein the atomic density of the deuterium in the non-polymeric thin film is about 30% of the atomic density of the thin film.

23. The device of claim 20, wherein the atomic density of the deuterium in the non-polymeric thin film is about 25% of the atomic density of the thin film.

24. The device of claim 20, wherein the atomic density of the deuterium in the non-polymeric thin film is about 2% of the atomic density of the thin film.

25. The device of claim 20, wherein the vapor deposition technique is high density plasma chemical vapor deposition (HDPCVD).

26. The device of claim 20, wherein the thin film comprises silicon and carbon.

27. The device of claim 20, wherein the thin film comprises silicon, oxygen, and carbon.

28. The device of claim 20, wherein the thin film comprises silicon, oxygen, carbon, and nitrogen.

29. The device of claim 20, wherein the vapor deposition technique includes using deuterated precursors comprising $SiD_4$ and $CD_4$.

30. The device of claim 20, wherein the vapor deposition technique includes using a first deuterated precursor comprising $SiD_4$ and at least one more precursor containing carbon.

31. The device of claim 20, wherein the vapor deposition technique includes using at least one deuterated precursor comprising silicon.

32. The device of claim 31, where the deuterated precursor comprising silicon is selected from the group consisting of $Si_2D_6$, $SiDCl_3$ and $SiD_2Cl_2$.

33. The device of claim 32, wherein the vapor deposition technique includes using an additional precursor comprising $CD_4$.

34. The device of claim 20, wherein the thin film is SiON with a refractive index of at least 1.59 such that the reduction in optical absorption is at least 10 dB at a wavelength within a band from 1.45 to 1.65 microns.

35. The device of claim 20, wherein the thin film is SiON with a refractive index of at least 1.59 such that the reduction in optical absorption is at least 20 dB at a wavelength within a band from 1.45 to 1.65 microns.

36. The device of claim 20, wherein the non-polymeric thin film is formed over an electronic device.

37. The device of claim 20, wherein the electronic device is a field effect transistor.

38. The device of claim 20, where the non-polymeric thin film comprises a composition selected from the group consisting of $SiO_2$ and $Si_3N_4$.

39. A method for making a device comprising an optical waveguide, the method comprising the steps of:
    forming a non-polymeric thin film comprising silicon, carbon and deuterium over a substrate with a vapor deposition technique using a precursor comprising deuterium, the non-polymeric thin film being suitable for use as an optical waveguide, an atomic density of the deuterium in the non-polymeric thin film being between about 0.1% and 30% of an atomic density of the thin film;
    forming a cover cladding over the thin film; and
    incorporating the non-polymeric thin film into a device.

40. A device comprising:
    a wafer;
    a cladding formed over the wafer;
    at least one non-polymeric thin film containing silicon, carbon and deuterium formed over the cladding, the non-polymeric thin film containing deuterium, an atomic density of the deuterium in the non-polymeric thin film being between about 0.1% and 30% of the atomic density of the thin film; and
    a cover cladding formed over the thin film.

* * * * *